United States Patent [19]

Wu

[11] Patent Number: 5,831,992
[45] Date of Patent: Nov. 3, 1998

[54] METHODS AND APPARATUS FOR FAULT DIAGNOSIS IN SELF-TESTABLE SYSTEMS

[75] Inventor: Yuejian Wu, Kanata, Canada

[73] Assignee: Northern Telecom Limited, Montreal, Canada

[21] Appl. No.: 948,034

[22] Filed: Oct. 9, 1997

Related U.S. Application Data

[63] Continuation of Ser. No. 516,248, Aug. 17, 1995, abandoned.

[51] Int. Cl.$^6$ .................................................. G01R 31/28
[52] U.S. Cl. ...................................... 371/22.4; 371/22.33
[58] Field of Search ............................. 371/22.31, 22.32,
371/22.33, 22.34, 22.5, 25.1; 395/183.01,
183.06, 185.01; 364/550

[56] References Cited

U.S. PATENT DOCUMENTS

| | | | |
|---|---|---|---|
| 4,503,537 | 3/1985 | McAnney | 371/25 |
| 4,910,735 | 3/1990 | Yamashita | 371/22.4 |
| 5,301,199 | 4/1994 | Ikenaga et al. | 371/22.5 |
| 5,347,523 | 9/1994 | Khatri et al. | 371/22.3 |
| 5,446,395 | 8/1995 | Goto | 324/763 |
| 5,450,414 | 9/1995 | Lin | 371/22.3 |
| 5,475,694 | 12/1995 | Ivanov et al. | 371/22.4 |

OTHER PUBLICATIONS

"There Is Information In Faulty Structures", McAnney et al, IEEE InternationalTest Conference, 1987, pp. 630–636.
"A Study of Faulty Signature For Diagnostics", Chan et al, IEEE Proc. ISCAS, 1990, pp. 2701–2704.
Improving the Efficiency of Error Identification via Signature Analysis:, Stroud et al, Proc. IEEE VLSI Test Symp., 1995, pp. 244–249.
"Identification of Failing Tests with Cycling Registers", Savir et al, IEEE Proc. Int. Test Conf., 1988, pp. 322–328.
"A Diagnostic Method Using Pseudo–Random Vectors Without Intermediate Signatures", Aitken et al, IEEE Proc. ICCAD, Nov. 1989, pp. 574–577.
"Diagnostics Basted on Faulty Signature", Chan et al, IEEE Proc. Int. Test Conf., 1989, pp. 935–935 (one page).
"Multiple Signature Analysis: A Framework for Built–In Self–Diagnostic", Karpovsky et al, IEEE Proc. FTCS, 1992, pp. 112–119.
"Design of Self–Diagnostic Boards by Multiple Signature Analysis", Karpovsky et al, IEEE Transactions on Computers, vol. 42, No. 9, Sep. 1993, pp. 1035–1044.
"Board–Level Diagnosis by Signature Analysis", Karpovsky et al, IEEE Proc. Int. Test Conf., 1988, pp. 47–43.
"On the Diagnostic Properties of Linear Feedback Shift Registers", Rajski et al, IEEE Trans. on CAD, Oct. 1991, pp. 1316–1322.
"On the Diagnostic Resolution of Signature Analysis", Rajski et al, 1990 IEEE, CH2924–9/90/0000/0364.
"Failure Diagnosis of Structured VLSI", Waichukauski et al, IEEE Design and Test of Computers, Aug. 1989, pp. 49–60.
"Diagnosis of BIST Failures by PPSFP Simulation", Waicukausk et al, IEEE Proc. Int. Test Conf., 1987, pp. 480–484.

*Primary Examiner*—Robert W. Beausoliel, Jr.
*Assistant Examiner*—Nadeem Iqbal
*Attorney, Agent, or Firm*—Angela C. de Wilton

[57] ABSTRACT

An analytical fault diagnostic methodology for use in complex VLSI chips. The method assumes a scan design environment and is capable of locating errors to the scan flops that capture the errors during test, independently of the number of errors that the circuit-under-test produces. The methodology is also capable of identifying the test vector or vectors under which the errors are generated. The apparatus which is designed to implement the method is also described. As the apparatus requires little hardware, the method is practical for chip level applications.

12 Claims, 2 Drawing Sheets

METHODS AND APPARATUS FOR FAULT DIAGNOSIS IN SELF-TESTABLE SYSTEMS

This application is a continuation, of application Ser. No. 08/516,248, filed on Aug. 17, 1995 entitled "Methods and Apparatus for Fault Diagnosis in Self-Testable Systems", now abandoned.

FIELD OF THE INVENTION

This invention relates to scan based built in self test systems and to such systems for fault diagnosis in a VLSI application.

BACKGROUND OF THE INVENTION

Built-In Self-Test (BIST) is a widely accepted means for testing today's large and complex VLSI chips. In BIST, both test pattern generation and test response analysis are usually conducted on the same chip as the circuit under test (CUT). To efficiently analyze the test response in silicon, BIST schemes usually employ a data compaction technique called signature analysis to compress the large amount of test response from the CUT into a small signature of a few bits. At the end of a test session, the collected signature is compared against a fault-free signature to determine whether the CUT is good or not. Although signature analysis significantly reduces the complexity of test response analysis in BIST environments, it adds extra difficulties in fault diagnosis.

Fault diagnosis is a process of locating physical faults to one or a set of primitive components according to the incorrect behaviour observed from a CUT. The definition of primitive components varies according to applications. For example, at circuit board level, the primitive components are usually IC chips. At IC chip level, the primitive components can be flip-flops, gates or transistors, depending on the resolution requirements of the applications. Usually, the higher the resolution requirements, the higher the complexity of the fault diagnosis process.

Fault diagnosis can be used for different reasons. For example, at circuit board or multiple chip module level, fault diagnosis is normally used to assist repair. At IC chip level, fault diagnosis is usually used to identify design or process errors during the early phase of production. At this stage, the errors found in fault diagnosis can be used to assist debugging of the design or to guide the adjustment of the fabrication process to improve yield. Fault diagnosis can also be used to analyze the chips that failed in the field in order to provide information about the weakness of the design and manufacturing process.

The present application deals with the fault diagnosis problem at IC chip level. Specifically, a new analytical fault diagnosis methodology targeting for VLSI BIST environments is presented. Based on faulty signature information, the diagnostic methodology achieves two goals. Firstly, it correctly locates errors to the CUT's outputs that produce the errors, independently of the number of errors these outputs may produce; secondly, it is also able to identify the test vector or vectors under which these errors are generated, with better resolution than that achievable by existing diagnostic methodologies.

Prior Art

Signature analysis used in BIST has introduced extra challenges to the problem of fault diagnosis. All the challenges are due to the fact that the error sequence generated at the outputs of a CUT has been compressed into a small faulty signature. Therefore, to locate the actual fault that causes the failure in test, it is first necessary to decipher the faulty signature to identify which output or outputs of the CUT was actually producing errors during test. Furthermore, it is also necessary to identify the values of the errors and to determine under which test vector or vectors these errors were produced. It is then possible to use the diagnostic techniques for conventional non-BIST environments to further locate a fault down to gates for example. Unfortunately, during the test response compaction process, a lot of error information is lost, thus destroying the one-to-one correspondence between faulty signatures and error sequences. This problem is the same as the well-known aliasing problem encountered in BIST test quality assessment. Although probabilistic analysis has shown that the diagnostic aliasing probability, i.e., the probability of locating an incorrect error sequence for a given faulty signature, is very low, being essentially the same as aliasing probability for signature analysis, the number of error sequences that can produce a given faulty signature is enormous. For practical test lengths, this number is usually well beyond millions. For example, let l be the length of the sequence to be compacted, and k be the length of the signature. The number of error sequences that can produce a given faulty signature can be estimated to be $2^{l-k}$, where l is in the order of hundreds of thousands or even millions and k is only about 16 to 32.

It can be seen from the above analysis that, given a faulty signature, correct fault diagnosis in BIST environments is a very challenging problem.

The possibility of using faulty signature information for fault diagnosis was first pointed out by McAnney and Savir in 1987 (Proc. Int. Test Conf., 1987, pp. 630–636). In this work, a fault diagnosis technique was developed. This technique was designed for single input signature analyzer implemented by a Linear Feedback Shift Register (LFSR), and guarantees correct fault diagnosis for single error sequences, i.e., sequences that only contain a single error bit. In Chan et al, (Proc. Int. Test Conf. 1990, pp. 553–561), a similar result was obtained for signature analyzers implemented with Multiple Input Shift Registers (MISR). Other techniques that use two LFSRs for fault diagnosis of sequences that contain single or double errors have also been reported. (Stroud et al, Proc. IEEE VLSI Test Symp. 1995, pp. 244–249, and Savir et al, Proc. Int. Test Conf., 1988, pp. 322–328.) The major deficiency of these techniques comes from their single/double error assumptions. Although these assumptions can be valid in some very extreme cases, e.g., for some very "hard" faults, these assumptions are in general unrealistic. In practical BIST environments, a single defect in a CUT can usually produce hundreds or thousands of errors in a test response sequence. Therefore, the techniques based on the single or double error assumptions are of little use in practice.

There is a simple relationship between single error signatures and multiple error signatures. For example, if a single error sequence $e_i(X)=X^i$ (i.e., a single error at the bit position i in the sequence) produces signature $S_i(x)$ and another single error sequence $e_j(X)=X^j$ produces $S_j(X)$, then a double error sequence $e_{ij}(X)=X^i+X^j$ will generate a faulty signature $S_{ij}(X)=S_i(x)+S_j(X)$, where "+" represents bit-wise XOR. This relationship is true in general for multiple errors. Based on the above observation, Chan et al (Proc. Int. Test Conf., 1989, pp. 935–936), developed a diagnostic technique for multiple error sequences. Unfortunately, the conclusion derived with this technique is very often misleading. It is easy to prove that this technique works only for sequences that contain fewer than t errors if the signature analyzer LFSR corresponds to a t-error correcting code, where t is very small compared to the number of possible errors in practice. In general, there are $2^{l-k}$ error sequences for every given faulty signature for a sequence length l and signature length k. Therefore, with the above techniques, it is impossible in general to correctly identify the real sequence that actually produced the faulty signature.

Another class of fault diagnostic methodologies was developed by Aitken et al (Proc. ICCAD, Nov. 1989, pp. 574–577) and Waicukauski et al (Proc. Int. Test Conf. 1987, pp. 480–484), based on post-test fault simulation. Compared to the available analytical techniques, these post-test simulation-based techniques can usually provide better resolution since they utilize more information from the faulty CUT. The major deficiency shared by the techniques in Aitken et al and Waicukauski et al is the large tester memory requirements. In addition, this technique also requires on-tester decision-making, i.e., it requires the test engineer to make the decision as to what to do next according to an intermediate result obtained during testing. This is undesirable in practice. Another deficiency is the lack of fault diagnostic capability for non-stuck-at faults.

Based on a complex coding technique, another type of diagnostic methodology was developed for circuit board level applications (Karpousky et al, Proc. FTCS, 1992, pp. 112–119). This method is capable of locating faults to the IC chips that produce errors during test. However, this methodology imposes substantial hardware overhead. Usually, it requires a dedicated ASIC chip to implement the coding technique. Therefore, this methodology is targeted only for circuit board level applications where the required amount of hardware overhead is allowed.

SUMMARY OF THE INVENTION

The present invention is based on an analytical fault diagnostic methodology for chip level applications. This method requires little hardware overhead, thus making it feasible for chip level applications. The method assumes a scan design environment, and is capable of locating errors to the scan flops that capture the errors during test, independently of the number of errors that the CUT produces. Moreover, the proposed methodology is also capable of identifying the test vector or vectors under which the errors are generated, with better resolution than that achievable by existing analytical techniques. In addition, the proposed diagnostic methodology does not require any on-tester decision-making. Compared to prior research, the proposed methodology is practical in that it does not restrict the number of errors that a CUT can produce, and in that its hardware is small enough for chip level applications.

Therefore, in accordance with a first aspect of the present invention, there is provided an apparatus for diagnosing faults in an integrated circuit utilizing scan-based built-in self-test functions. The apparatus includes a signal generator to input a pseudo-random test vector to a plurality of scan chains in said integrated circuit; a programmable data compactor to analyze test response data from said scan chains and to compress said data into an intermediate signature; a secondary data compactor in communication with said programmable compactor, said secondary compactor compressing said intermediate signature; control means associated with said programmable compactor to cause said intermediate signature to be transferred to said secondary compactor and thereafter to instruct said signal generator to input a further test vector to said scan chains; and means to download the contents of said secondary compactor to off-chip storage means after a plurality of test vectors have been scanned.

In accordance with a second aspect, the present invention provides a method of diagnosing faults in an integrated circuit wherein the integrated circuit has scan based built-in self-testability, the method comprising:
  (a) select a chain of processing elements in the integrated circuit to be scanned;
  (b) scan a first test vector into a plurality of scan chains including said selected chain;
  (c) capture scan test data in said selected chain;
  (d) compress said scan test data in said programmable compactor to generate an intermediate signature;
  (e) compress said intermediate signature in a secondary compactor;
  (f) clear said intermediate signature from said programmable compactor;
  (g) scan a further test vector into said scan chain and generate a further intermediate signature in said programmable compactor;
  (h) compress said further intermediate signature in said secondary compactor; and
  (i) download the contents of said second compactor to an external storage means for off-line analysis after a plurality of test vectors have been applied.

BRIEF DESCRIPTION OF THE DRAWINGS

The invention will now be described in greater detail with reference to the attached drawings wherein.

DETAILED DESCRIPTION OF THE INVENTION

Figure 1:
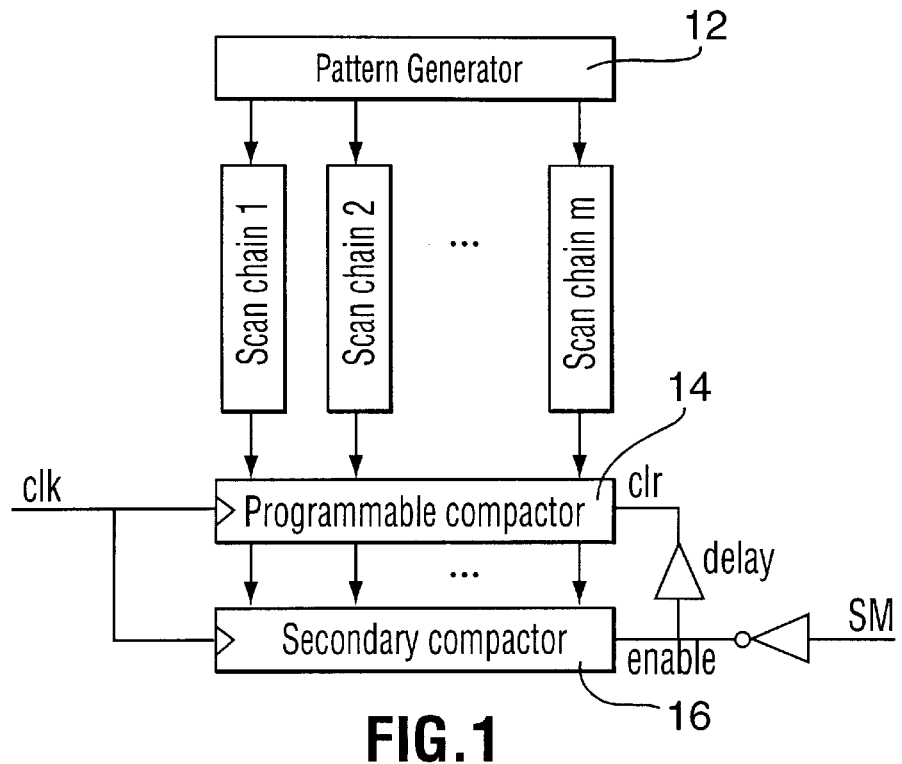
FIG. 1 is a block diagram of the fault diagnosis circuit according to a first embodiment of the invention.

FIG. 1 is a block diagram of the functional elements according to a first embodiment of the invention. These elements include pattern generator 12 which is capable of generating a plurality of pseudo-random test vectors. Scan chain 1 to scan chain m represent the circuit components within the CUT for which fault diagnosis is required. Programmable compactor 14 to be discussed in greater detail hereinafter analyzes and compacts test data from the scan chains to create an intermediate signature. Secondary compactor 16 accepts a sequence of the intermediate signatures from programmable compactor 14 and compresses these signatures further to generate a final fault signature.

In FIG. 1, the programmable data compactor 14 is a data compactor with a programmable feedback polynomial. For example, the programmable data compactor 14 can be a programmable LFSR (Linear Feedback Shift Register), a programmable MISR (Multiple Input Shift Register), a programmable CA (Cellular Automata), or a programmable GLFSR (Generalized Linear Feedback Shift Register). The secondary data compactor 16 is a multiple input data compactor, which can be a MISR, a multiple input CA or a GLFSR.

It is to be assumed that all the scan chains are of equal length. In this application a scan flop frame i is a set of scan flops that contains all the $i^{th}$ scan flops from all the scan chains. In addition, it is initially assumed that all the scan chains work at the same frequency, for simplicity.

The diagnostic methodology consists of two levels of data compaction. It first compresses the test response to a test vector into the programmable data compactor 14; and then it compresses the content of the programmable data compactor into a secondary data compactor 16 after all the test response to the test vector has been compressed. After the content of the programmable compactor 14 has been compressed, the programmable compactor 14 is cleared, and then used to compress the test response to a next test vector. After all test vectors have been applied, the signature obtained in the secondary compactor 16 is saved for off-line analysis. Then, the programmable compactor 14 is set to another feedback polynomial, and the whole process is repeated until an adequate number of signatures have been collected. The following procedure summarizes the process.

1. Set i=1;
2. Set the programmable data compactor 14 to polynomial $f_i(x)$;
3. Scan a test vector into the scan chains by setting the scan mode signal SM=1;
4. Capture the test response by setting SM=0;
5. Scan in another test vector by setting SM=1, and at the same time scan out the test response captured in the scan flops and compress them with the programmable register 14;
6. After all the test response to the test vector has been compressed into the programmable compactor 14 (in the meantime, a new test vector has been shifted into the scan chains), set SM=0 to capture the test response to the new test vector, and at the same time compress the content in the programmable compactor 14 into the secondary compactor 16;
7. Then, clear the programmable compactor 14 with the signal clr;
8. Go to Step 5, until all the test vectors are applied;
9. Save the signature collected in the secondary compactor 16 for off-line analysis;
10. Set i=i+1;
11. Go to Step 2, until an adequate number of signatures have been collected.
12. Stop.

The feedback polynomials used for the programmable data compactor 14 i.e., to implement a data compaction function are required to follow certain error control coding rules. For example, the feedback polynomial can be defined as $f_i(x)=x-\alpha^i$ where $\alpha$ is a primitive element over Galois field $GF(2^m)$.

It is usually required to repeat the same test vector set 2t times if up to t scan flop frames in the scan chains will capture or produce errors during test. Under single fault or single defect assumption, t can easily be determined by tracing the netlist of the CUT. In fact, in this case, t is equal to the maximum number of scan flops on a single chain that a single fault in the CUT may affect.

The hardware overhead imposed by the proposed methodology is very small. In the case shown in FIG. 1, the hardware overhead is the programmable compactor. As will be shown later, this programmable compactor can either be used for aliasing reduction in normal BIST mode or be shared by normal BIST circuitry. Obviously, another type of cost imposed by the proposed methodology is the extra tester time required to repeat the same test set 2t times. However, compared to hardware overhead, which imposes recurring silicon cost for every single chip, the tester time expenditure is just a one-time cost only for a few faulty chips that require fault analysis. Furthermore, the proposed diagnostic methodology is independent of specific CUT designs, i.e., it uses the same hardware for all CUT designs. In addition, in both the normal BIST mode and the diagnostic mode, the proposed methodology does not affect the at-speed operation provided by some BIST techniques.

Having collected enough signatures by applying the procedure described previously, the information of the collected signatures can be used to identify the locations of the failing scan flops or failing scan flop frames. Usually, if there can be up to t failing scan flop frames in the structure described in FIG. 1, 2t signatures are required.

Assuming that 2t signatures have been collected, the procedure can be represented by the following equations:

$$\Delta S = H_{PC} E H_{SC} \qquad (Eq1)$$

$$= H_{PC}[\Delta S^1_{sf}, \Delta S_{sj}^2 \ldots \Delta S_{sj}^n] \qquad (Eq2)$$

where $\Delta S$ is the 2t error signatures collected; $H_{PC}$ represents the checking matrix of the code generator corresponding to the programmable compactor when it is used 2t times as previously described; $H_{SC}$ represents the checking matrix of the code generator corresponding to the secondary compactor; and E represents the error matrix where each entry $E(\tau,i)$ is the error from the $i^{th}$ scan flop frame in response to the test vector $\tau$, E is of the size NxT, where N is the scan chain length, T is the number of test vectors in the test set, and $\Delta S_{SF}^i$ can be considered as the intermediate error signature for scan frame i.

The above equations consist of 2t equations if 2t signatures are collected. If there can be up to t failing scan flop frames, there are 2t unknown variables in the above equations. Therefore, the above equations provide a unique solution to these 2t unknown variables. Among the unknown variables, t of them are the locations of the failing scan flop frames and the others are the intermediate error signatures each for a failing scan flop frame.

Although this technique is able to identify the scan flop frames that captured errors during the test, we still do not know exactly which scan flops failed.

In a second embodiment of the invention an approach that correctly locates errors in the failing scan flops is provided.

Figure 2:
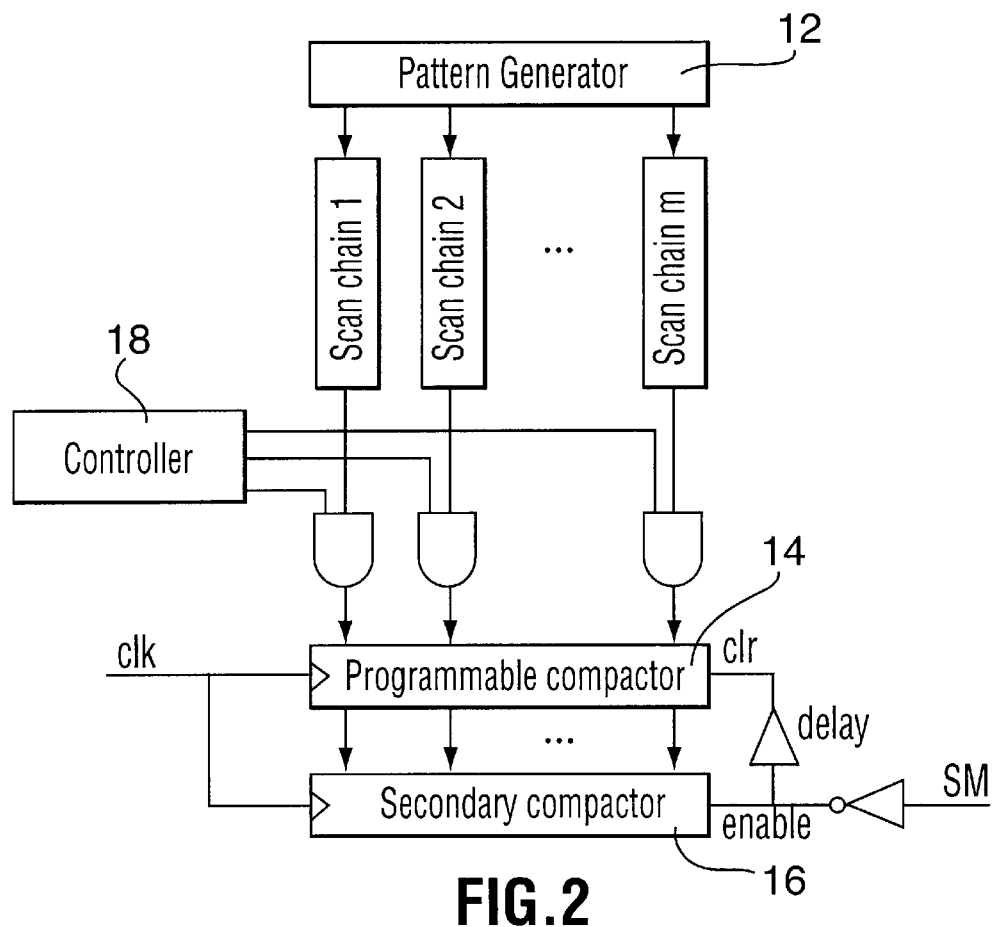
FIG. 2 is a block diagram of a second embodiment.

In FIG. 1, all the scan chains are tested at the same time, and the test responses from all the scan chains are analyzed in parallel. Therefore, when the $i^{th}$ scan flop in the $j^{th}$ scan chain fails, the approach presented in FIG. 1 can only point out that the $i^{th}$ scan flop frame, which consists of all the $i^{th}$ scan flops from every single scan chain, contains errors, without knowing exactly which scan flop from which scan chain fails. To solve the resolution problem, an approach is to treat the multiple scan chains as multiple single scan chains, i.e., diagnose one chain at a time. In other words, the entire test set is applied to all the scan chains, but the test response from only a single chain is analyzed. This can be accomplished by gating the scan-out data as shown in FIG. 2. As shown, controller 18 is used to select the test responses.

Assume the maximum t for scan chain i to be $t_i$, where $0 \leq i \leq m-1$. Under the single fault assumption, $t_i$ is equal to the maximum number of scan flops in the $i^{th}$ scan chain that can be affected by a single fault in the CUT. In this case, the test set to a CUT is repeated $2t_i$ times to diagnose its $i^{th}$ scan chain. Each time the complete test set is applied to all the scan chains, but only the test responses from the $i^{th}$ scan chain are fed into the compactors.

Obviously, this approach guarantees correct fault diagnosis to failing scan flops at the cost of increased hardware requirements. In this case, the extra hardware requirements include a $\log_2(m)$ bit counter plus some gates.

In terms of tester time, the test one chain at a time approach requires:

$$\Gamma = 2T \sum_{i=0}^{m-1} t_i \qquad \text{(Eq3)}$$

where T is the tester time to apply the test vector set once.

It is easy to show that $\Gamma$ is the same as that required by the approach shown in FIG. 1 in the worst case. By worst case, it is meant that the $t_i$ scan flop frames from each chain are disjointed.

Therefore, as a guideline to the CUT design, $t_i$ should be minimized by partitioning the scan flops that can be affected by a single circuit node into different scan chains.

Tester time reduction for the approach shown in FIG. 2 is possible if the required tester time for the approach shown in FIG. 1 is less than $\Gamma$, i.e., less than the worst case tester time. In this case, we first fault diagnose all the chains in parallel as shown in FIG. 1, to identify the failing scan flop frames. Then, the scan chains are tested one at a time without fault diagnosis, simply to identify the failing chains. In this way, it is known that, in the failing scan flop frames, only those scan flops from the failing scan chains may produce errors. Thus, the total tester time is T(2t+m), where 2Tt is the tester time to identify the failing scan flop frames, and Tm is the tester time to identify failing chains.

After identifying the scan flops that capture errors during test, it is usually required to further locate the gates that actually produce the errors.

One approach follows the same strategy as other analytical BIST diagnostic techniques. That is, to identify the failing test vectors, and then analyze these vectors, by simulation for example, to identify the faulty gate or gates.

For scan chain j, after repeating the test set $2t_j$ times, we know exactly the failing scan flop positions $i_1, i_2, \ldots, i_{t_j}$, as well as the intermediate signatures $\Delta S_{sf}^{i_1}, \Delta S_{sf}^{i_2}, \ldots,$ and $\Delta S_{sf}^{i_{tj}}$, by solving Equation 1. In fact, $\Delta S_{sf}^{i_n}$, where $1 \leq n \leq t_j$, is equivalent to the error signature calculated by the secondary compactor under the assumption that scan chain j consists of only a single flop, i.e., scan flop $i_n$. With the intermediate signatures for the failing flop $i_n$, it is possible to identify the test vectors that generate errors in scan flop $i_n$, given that the number of such test vectors is small. In general, we can identify up to r such test vectors if the secondary data compactor implements a r-error correcting code.

Compared to existing analytical approaches, the presented approach yields better diagnostic capacity (measured by the number of failing test vectors that the approach guarantees to identify), and thus better resolution. This is because this approach is able to separate the failing scan flops and provides an independent error signature for each of these flops. In comparison, the existing approaches have only a single signature for all the failing flop $i_n$. For example, if test vectors $\tau_1$ and $\tau_2$ generate two errors in scan flops $i_1$ and $i_2$, respectively, the error sequence seen by the existing approaches is a double error sequence, while it is seen by our approach as two independent single error sequences, one generating $\Delta S_{sf}^{i_1}$, and the other generating $\Delta S_{sf}^{i_2}$.

After knowing the exact positions of the failing scan flops, another possible approach to locate faults is to analyze the structure of the CUT. Under the single fault assumption, the circuit node or nodes that exactly fanout to all the failing scan flops are the best candidate fault sites. If no such nodes exist, other circuit nodes, such as those that fanout to all the failing scan flops, can be used as a candidate, or multiple faults should be considered.

The programmable compactor required in the proposed diagnostic methodology can be used to reduce the aliasing in normal BIST operations. Since the programmable compactor can be set to a different primitive feedback polynomial than that for the secondary compactor, the aliasing probability achieved by a single compactor in normal BIST environments can be reduced from $2^{-m}$ to $2^{-2m}$, assuming both compactors are of length m and primitive.

In this case, the only required modification to the approach shown in FIG. 1 is to enable the secondary compactor and disable the clr signal in the normal BIST mode.

If it is decided to diagnose one chain at a time, the extra compactor required by the proposed method can be shared with the normal BIST circuitry. In this case, we can use a m-stage compactor for normal BIST mode. In diagnostic mode, the m-stage compactor can be split into two, compactor$_1$ and compactor$_2$. Compactor$_1$ can be used for the programmable compactor and compactor$_2$ for the secondary compactor. In this case, the total hardware overhead imposed by the proposed diagnostic approach is two controllers, one for the scan chain selection as shown in FIG. 2 and the other for the polynomial selection required by the programmable compactor. The controller for scan chain selection requires a $\log_2(m)$ bit counter plus some gates if there exist m scan chains. The controller for polynomial selection requires a $\log_2(N+1)$ bit counter plus some gates, if the longest scan chain consists of N scan flops. In this case, the length of the programmable compactor must be greater or equal to $\log_2(N-1)$. The length of the secondary compactor must be long enough to guarantee satisfactory aliasing.

The methodology uses the same diagnostic hardware for all CUT designs. By specifying the $t_i$'s for each specific CUT, this methodology also adapts very well to the different requirements of different CUTs. For different CUTs, the tester time requirement for diagnosis can be quite different although the diagnostic hardware is always the same. Compared to hardware overhead, which imposes recurring silicon cost to every single chip, the tester time expenditure is a non-recurring cost only for the few faulty chips that require fault analysis. However, in some special cases, the required tester time may become unacceptable. In this case, the proposed methodology allows trade-off between hardware overhead and tester time requirement.

Figure 3:
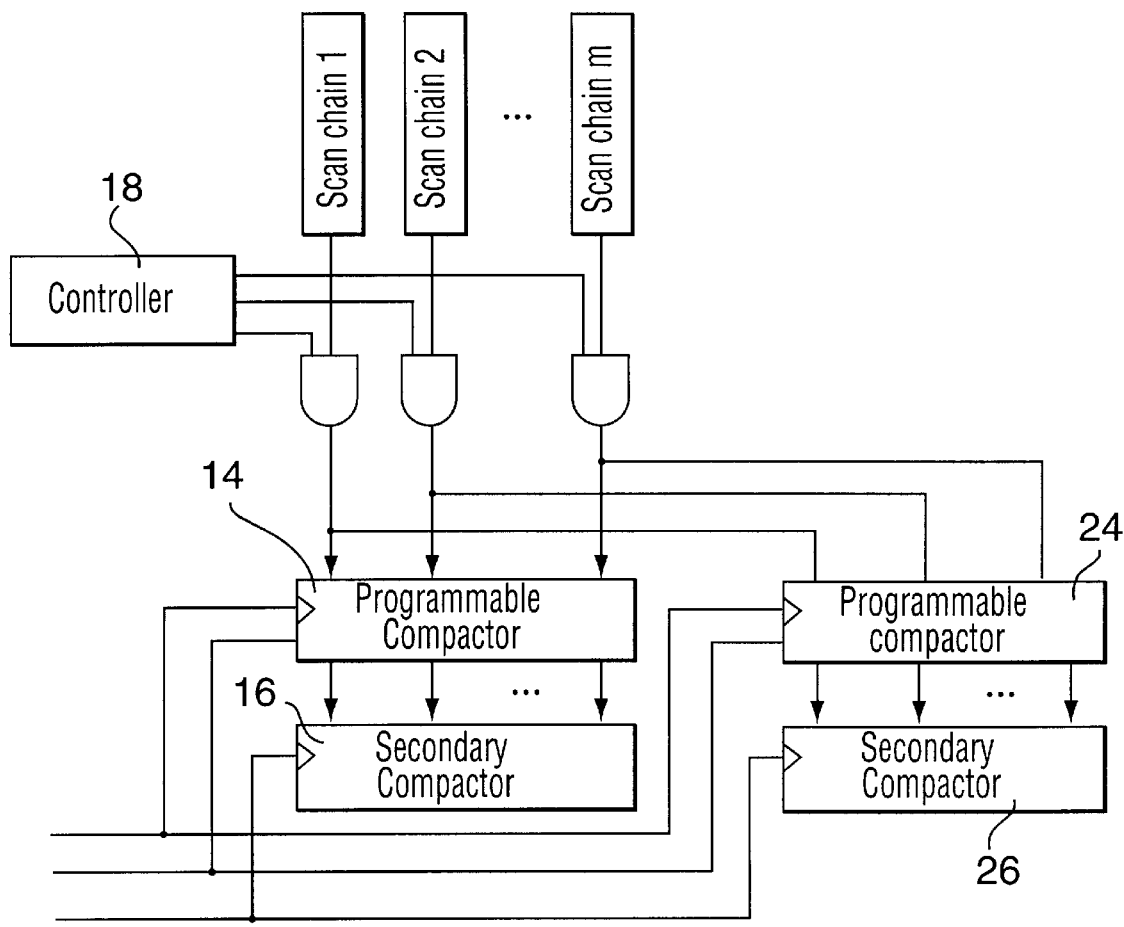
FIG. 3 is a block diagram of an embodiment of the invention utilizing two sets of diagnostic hardware.

For example, if it is advantageous to reduce the tester time by half, two sets of the diagnostic hardware can be used. Each set consists of a programmable compactor 14,24 and a secondary compactor 16,26. FIG. 3 shows such a configuration.

In diagnostic mode, the two programmable compactors 14,16 are set to different feedback polynomials $f_1(x)$ and $f_{2i}(x)$, where $1 \leq i \leq t_j$ for scan chain j. The two secondary compactors 16,26 are always of the same feedback polynomial. In this case, to identify up to $t_j$ failing scan flops in a chain, we only need to repeat the test set $t_j$ times, as opposed to $2t_j$ times.

In general, multiple copies of the diagnostic hardware can be used if the amount of hardware overhead is acceptable. In an extreme case, to locate up to t failing scan flops in a chain, one can use 2t sets of the diagnostic hardware.

In the multiple frequency BIST environment, all the flops on a same scan chain work at the same frequency. In this case, we can easily extend our diagnostic methodology to this environment if we analyze the test responses from one chain at a time.

The basic idea is that when we analyze the test responses from a scan chain working at clock $clk_j$, we simply replace the signals clk and SM shown in FIGS. 1 and 2 with the signals $clk_i$ and $SM_i$, respectively, where $SM_i$ is the scan mode signal for scan chains working at clock $clk_i$. Since this modification is required only for diagnostic mode, the normal BIST operations will not be affected. In normal BIST mode, all the scan chains will still be analyzed at the highest clock frequency. It should be pointed out that the diagnostic mode can also run at speed.

The methodology guarantees correct identification of the scan flops that capture errors during test, independently of the number of errors the circuit under test (CUT) may produce. The proposed methodology is CUT independent in that it uses the same diagnostic hardware for all CUT designs. On the other hand, it is also a CUT-specific methodology because it assigns different tester time to different CUTs according to their structures. The methodology does not assume any specific fault model in the CUT. Thus, it can be used to diagnose non-stuck-at faults in a CUT, such as timing failures, for example. The methodology also supports at-speed BIST operations and fits well in the multiple frequency BIST environment.

In addition to the failing scan flops, the methodology is also able to identify the failing test vectors with a better resolution than existing analytical diagnostic methodologies.

Although specific embodiments of the invention have been illustrated and described, it will be apparent to one skilled in the art that variations and alternatives to these embodiments are possible. It is to be understood, however, that such variations and alternatives may fall within the scope of the invention as defined by the appended claims.

I claim:

1. A method of diagnosing faults in an integrated circuit the integrated circuit comprising a test vector generator, a programmable data compactor and a secondary data compactor, the method comprising:

applying a series of test vectors, for each test vector performing a sequence of test steps:

capturing scan test response data from each test vector, compressing the test response data using the programmable data compactor to implement a first data compaction function to generate an intermediate signature;

compressing the intermediate signature in a secondary data compactor;

clearing the intermediate signature from the programmable data compactor;

and downloading the content of the secondary data compactor to an external storage for off-line fault analysis after the series of test vectors have been applied;

and then, after programming the programmable data compactor to implement a different data compaction function, applying another series of test vectors, repeating the sequence of test steps using the different data compaction function;

for each data compaction function, comparing contents of the secondary data compactor downloaded to external storage with stored values for each series of test to provide diagnostic information for identifying a faulty element in the circuit and an error vector under which the fault occurred.

2. A method according to claim 1 wherein implementing a data compaction function of the programmable data compactor, comprises setting the programmable data compactor to a programmable feedback polynomial selected from a set of predefined polynomials.

3. A method of diagnosing faults in an integrated circuit, the integrated circuit having scan based built-in self-testability, including a test vector generator, a programmable data compactor and a secondary data compactor, the method comprising:

a) programming the programmable data compactor to implement a data compaction function using a first feedback polynomial selected from a set of predefined polynomials;

b) scanning a test vector into a plurality of scan chains;

c) capturing scan test response data to the test vector in the scan chains;

d) compressing the test response data in the programmable data compactor to generate an intermediate signature;

e) compressing the intermediate signature in a secondary data compactor;

f) clearing the intermediate signature from the programmable data compactor;

g) scanning a further test vector into the scan chains and generating a further intermediate signature in the programmable data compactor;

h) compressing the further intermediate signature in the secondary data compactor;

i) clearing the further intermediate signature from the programmable data compactor;

j) downloading the content of the secondary data compactor to an external storage for off-line fault analysis after a series of test vectors have been applied; and k) setting the programmable data compactor to implement a different data compaction function by using another feed back polynomial and then repeating steps b) to j);

for each data compaction function and for each series of test vectors, comparing the content of the secondary data compactor downloaded to external storage with stored values to provide diagnostic information for identifying a faulty element in the circuit and an error vector under which the fault occurred.

4. A method according to claim 3 wherein step (k) is repeated a plurality of times.

5. A method according to claim 3 wherein the integrated circuit comprises a plurality of scan chains and the method comprises capturing the test response data in a single scan chain.

6. A method according to claim 3 wherein the integrated circuit comprises a plurality of scan chains, and the method comprises capturing the test response data to the plurality of scan chains sequentially one at a time.

7. A method according to claim 3 wherein the integrated circuit comprises a plurality of scan chains, and the method comprises capturing test response data from multiple scan chains using multiple programmable data compactors.

8. A method according to claim 3 wherein transfer of data from the programmable data compactor to the second data compactor occurs only at selective clock cycles under control of a scan mode signal.

9. An apparatus for diagnosing faults in an integrated circuit using a scan based built-in self-test function, the apparatus comprising;

a signal generator to input a pseudo-random test vector to a plurality of scan chains in the integrated circuit;

a programmable data compactor having control means for selecting one of a plurality of data compaction functions of the programmable data compactor for analyzing test response data from the scan chains and compressing the data into an intermediate signature using a selected one of the plurality of data compaction functions;

a secondary data compactor in communication with the programmable data compactor, the secondary data compactor for compressing the intermediate signature;

control means associated with the programmable space compactor to cause the intermediate signature to be transferred to the secondary data compactor and thereafter to instruct the signal generator to input a further test vector to the scan chains;

and means to download the contents of the secondary data compactor to external storage means for fault diagnosis after a plurality of test vectors have been scanned.

10. An apparatus for diagnosing faults in an integrated circuit using a scan based built-in self-test function, the apparatus comprising;

a signal generator for inputting a series of pseudo-random test vectors to a plurality of scan chains in the integrated circuit;

a programmable data compactor for analyzing test response data from the scan chains in response to each test vector and compressing the test response data into an intermediate signature, the programmable data compactor capable of implementing a selected one of a plurality of data compaction functions;

a secondary data compactor in communication with the programmable data compactor, the secondary data compactor for compressing the intermediate signature;

control means associated with the programmable space compactor for causing the intermediate signature to be transferred to the secondary data compactor, for selecting another one of the plurality of data compaction functions and thereafter for instructing the signal generator to input a further series of test vector to the scan chains;

and means to download the contents of the secondary data compactor to external storage means for fault diagnosis after each series of test vectors have been scanned.

11. An apparatus for diagnosing faults in an integrated circuit as defined in claim 10 comprising a data controller associated with the programmable data compactor whereby test response data from the scan chains is supplied sequentially to the programmable data compactor.

12. An apparatus for diagnosing faults in an integrated circuit as defined in claim 10 further having multiple programmable data compactors and multiple secondary data compactors.

* * * * *